United States Patent [19]

Kukkonen

[11] Patent Number: 5,434,537
[45] Date of Patent: Jul. 18, 1995

[54] CIRCUIT FOR MEASURING THE OUTPUT POWER FROM AN AMPLIFIER

[75] Inventor: Osmo Kukkonen, Salo, Finland

[73] Assignee: Nokia Mobile Phones Ltd., Salo, Finland

[21] Appl. No.: 193,282

[22] Filed: Feb. 8, 1994

[30] Foreign Application Priority Data

Feb. 12, 1993 [FI] Finland .................................. 930632

[51] Int. Cl.6 .................................................. H03G 3/30
[52] U.S. Cl. .............................................. 330/2; 330/140
[58] Field of Search ............................ 330/129, 140, 2; 455/115, 126

[56] References Cited

U.S. PATENT DOCUMENTS

| 4,392,245 | 7/1983 | Mitana | 455/115 |
| 5,204,637 | 4/1993 | Trinh | 330/129 |
| 5,291,150 | 3/1994 | Saarnimo et al. | 330/140 X |

FOREIGN PATENT DOCUMENTS

| 0472330A3 | 2/1992 | European Pat. Off. |
| 0509733A2 | 10/1992 | European Pat. Off. |
| 0524806A1 | 1/1993 | European Pat. Off. |

OTHER PUBLICATIONS

Finnish Office Action dated 23 Sep. 1993 on priority Finnish Application No. 930632 and English translation thereof.
Patent Abstracts of Japan, vol. 16, No. 567 (E-1296) 8 Dec. 1992 and JP-A-04 219 001 (Fujitsu) "Microwave Band Amplifier".
Patent Abstracts of Japn, vol. 9, No. 69, (E-305) 29 Mar. 1985 & JP-A-59 207 750 (Nippon Technical KK) "Receiving Circuit".

Primary Examiner—Steven J. Mottola
Attorney, Agent, or Firm—Perman & Green

[57] ABSTRACT

The object of the invention is a circuit for monitoring the power of a transmitter amplifier. In the solution according to the invention, the detected DC voltage level ($V_{det}$) corresponding to the output power is compressed at high output levels by using as the coupling capacitance a capacitance diode (7) such that the capacitance of this component, and thereby the tightness of the coupling, diminishes as the detected voltage level increases. The invention can be employed, for example, in the power control of a mobile phone's transmitter.

4 Claims, 3 Drawing Sheets 5,434,537

CIRCUIT FOR MEASURING THE OUTPUT POWER FROM AN AMPLIFIER

FIELD OF THE INVENTION

This invention relates to a circuit for measuring output power from an amplifier. The invention can be employed, for example, in controlling the power of a radio telephone transmitter.

BACKGROUND OF THE INVENTION

In high frequency technology power detectors are used, amongst other things, for generating the necessary feedback signal for power regulation. This signal is usually a sample taken with a directional coupler from a forward RF field and is rectified to a corresponding DC level that is dependent on the magnitude of the forward power.

The prior art is discussed in the following with reference to the accompanying FIG. 1, which presents a wiring diagram of a power detector according to the prior art.

In the circuit shown in FIG. 1, the directional coupler marked with the reference number 1 has been implemented utilising microstrip. When the sampled power is rectified, this yields the detected DC voltage level $V_{det}$ corresponding to the output power $P_{out}$. In the FIGURE the power detector diode is marked with the number 2, the capacitors with the numbers 3, 4 and the resistors with the numbers 5, 6.

It is often necessary to make the directional coupler's coupling coefficient large so that with small voltage levels the DC voltage can be detected and its gradient of change can be made sufficiently large. This has the drawback that with large voltage levels the detected DC voltage level grows far too large. In devices operating at low operating voltage levels such as radio telephones, the processing of this signal, of which the level is excessively large, becomes impossible and thus the power range that must be treed is limited as a consequence of this.

A patent related to an automatic control circuit of the output of RF power amplifiers having a wide dynamic range has previously been presented (U.S. Pat. No. 4,602,218). As far as extending the power range is concerned, the circuit according to the patent is based on the use of a logarithmic amplifier. In the circuit according to the patent, a linearly dependent RF sample level (the coupling coefficient being constant) is taken, for the detector, from the power level with a coupling capacitor and then the sample is shaped with the logarithmic amplifier before the detection. This is a complicated way of implementing rite function in question and the solution calls for a lot of components.

SUMMARY OF THE INVENTION

The present invention provides a circuit for monitoring power output ($P_{OUT}$) from an amplifier, comprising controllable sampling means for sampling the power output ($P_{OUT}$) from the amplifier, and detecting means coupled to an output of the sampling means for generating a DC voltage ($V_{det}$) corresponding to the magnitude of a sample from the sample means, wherein a potion of the DC voltage ($V_{det}$) is coupled to a control input of the sampling means (7) for controlling the level of sampling of the power output ($P_{OUT}$) from the amplifier. This invention has the advantage in that very few components are required for wide range monitoring of signals when compared with the prior art.

In a preferred embodiment the controllable sampling means comprises a varactor diode and the portion of said DC voltage ($V_{det}$) is coupled to the varactor diode to vary the reverse bias voltage of the varactor corresponding to the magnitude of the portion of said DC voltage ($V_{det}$) which is a particularly straight forward and hence cost effective way of implementing the invention.

DESCRIPTION OF SPECIFIC EMBODIMENTS OF THE INVENTION

Figure 1:
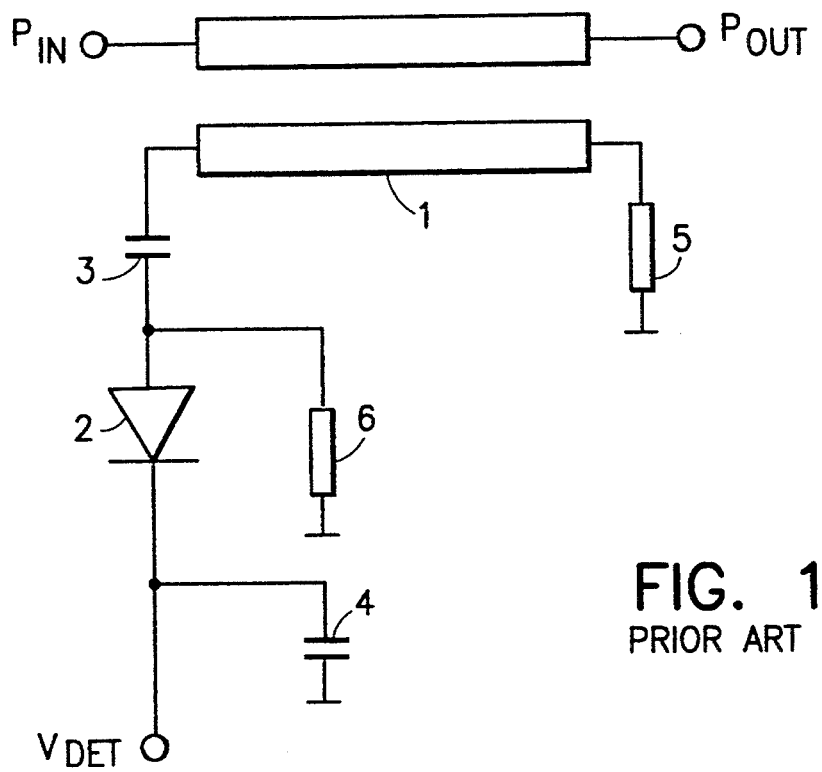
FIG. 1 presents a wiring diagram according to the prior art already discussed.

FIG. 1 has been discussed hereinabove. An embodiment in accordance with the present invention is described in the following with reference to FIGS. 2–5.

Figure 2:
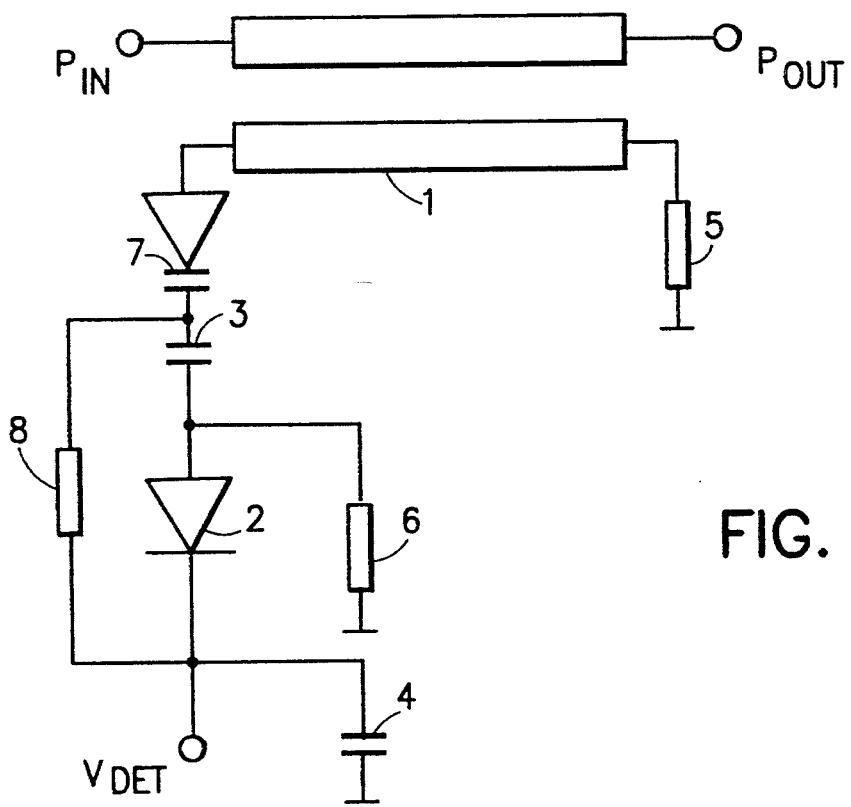
FIG. 2 presents a wiring diagram of a power detector in accordance with the present invention.

FIG. 2 presents the wiring diagram of a power control circuit in accordance with the present invention. In the circuit the components marked with the reference numbers 1–6 are the same as for the abovedescribed FIG. 1. As shall be made apparent in the following, the idea behind the invention resides in the fact that the coupling coefficient of the circuit is controlled with a capacitance diode 7, which is controlled by a signal that is obtained directly from the voltage level $V_{det}$ via a resistor 8.

Figure 3:
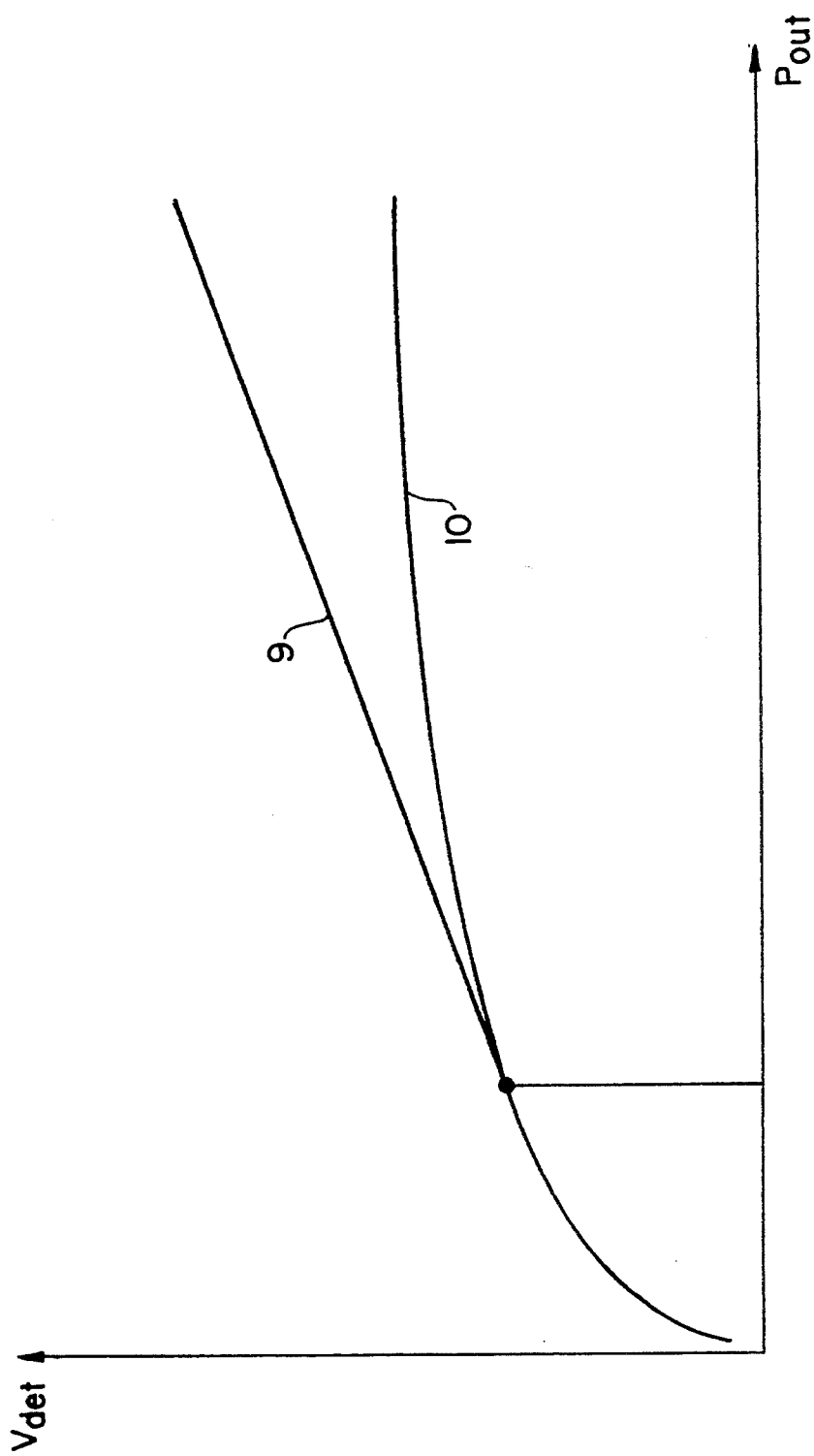
FIG. 3 presents the voltage ($V_{det}$) of a circuit in accordance with the present invention and according to the prior art as a function of the power ($P_{out}$)

FIG. 3 presents the voltage ($V_{det}$) of a circuit in accordance with the invention and a circuit according to the prior art as a function of the power ($P_{out}$). The upper curve 9 presents the voltage of a circuit according to the prior art as a function of the power. The lower curve 10 in turn presents the voltage of a circuit in accordance with the invention as a function of the power.

When the power level, or $P_{out}$, rises, the detected DC voltage $V_{det}$ rises too. Via resistor 8 this increases the reverse voltage of the capacitance diode 7, whereby its capacitance diminishes. As a consequence of this, the RF voltage that is applied to the power detector diode 2 diminishes. Accordingly, the detected DC voltage level is compressed at high power levels. The initial point and gradient of the compression can be set as desired by selecting for use a capacitance diode 7 that is equipped with an appropriate capacitance/reverse voltage curve.

Figure 4:
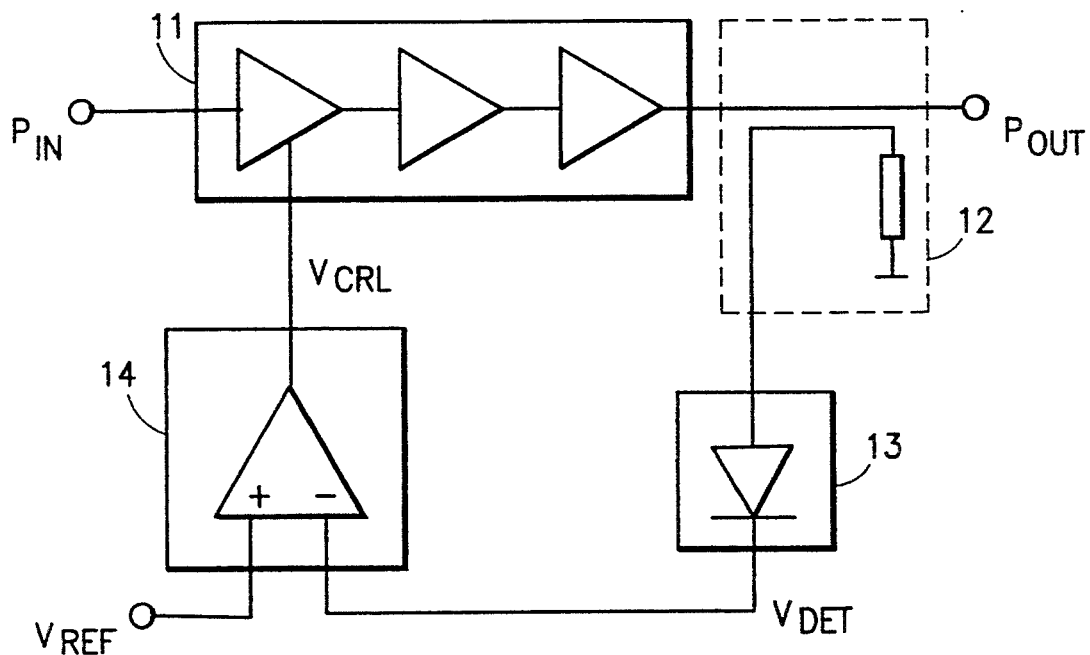
FIG. 4 presents a block diagram of the power control of a mobile phone's transmitter by means of a solution in accordance with the present invention.

FIG. 4 presents the block diagram of the power control of a radio telephone transmitter in accordance with the invention. The input power $P_{in}$ is obtained from the driver stages and is applied to the transmitter's output amplifier 11, from which the amplified power $P_{out}$ is extracted via the directional coupler 12, then passing to the duplex filter and ahead to the antenna.

A sample of the output power is taken with the directional coupler 12 and passed to a power detector 13, which forms the power-dependent DC voltage $V_{det}$. This DC voltage is passed ahead to the differential amplifier 14, which produces the control voltage $V_{crl}$ to the output amplifier 11 for controlling the power level. The magnitude of this control voltage can be controlled to correspond to the desired power level by altering the reference voltage $V_{ref}$. The circuit's directional coupler 12 and power detector 13 are implemented in accordance with the invention in such manner that a more extensive power range is advantageously obtained for use in the same voltage range of the reference voltage $V_{ref}$.

Figure 5:
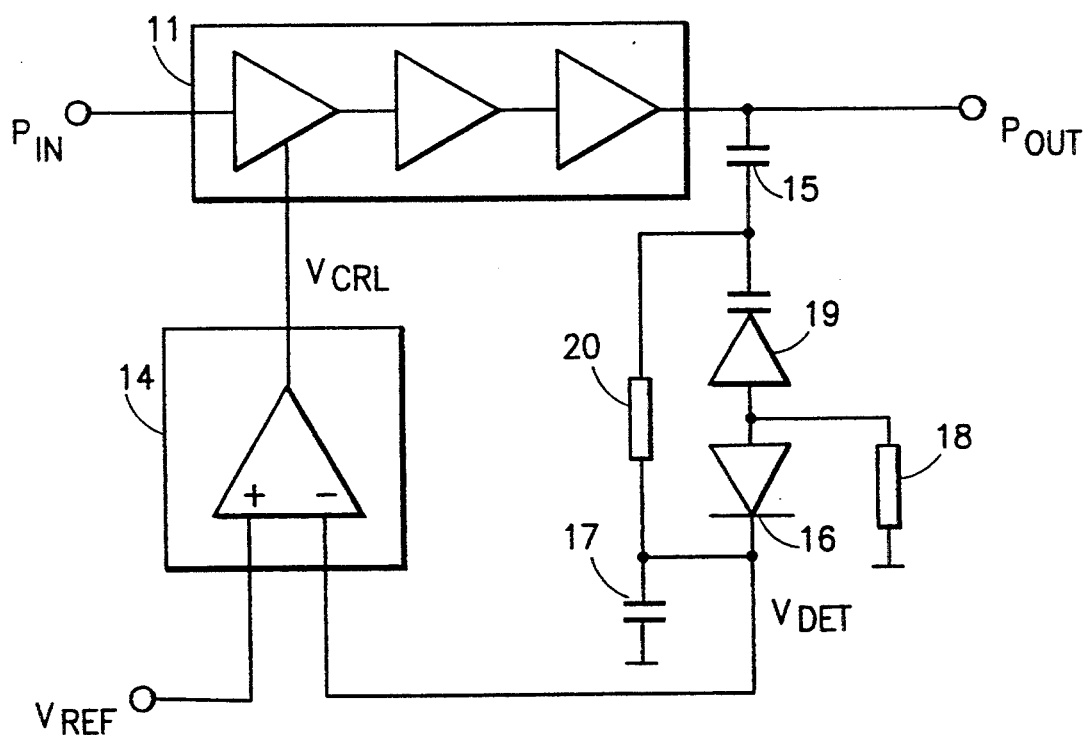
FIG. 5 presents a block diagram of the power control of a mobile phone's transmitter by means of an alternative solution in accordance with the present invention.

FIG. 5 presents a block diagram of the power control of a radio telephone transmitter by means of an alternative embodiment in accordance with the invention. The directional coupler 12 has been replaced by a coupling capacitor 15 and the FIGURE also shows, represented at the component level, the compression circuit of the voltage range in accordance with the invention. In the circuit the output amplifier is still marked with the number 11, the differential amplifier with the number 14, the capacitance diode with the number 19, the power detector diode with the number 16, the capacitors with the numbers 15, 17 and the resistors with the numbers 18, 20. The solution is simple and calls for only a small number of components.

In a circuit in accordance with the invention, the coupling coming to the detector from the directional coupler is thus reduced as the power level increases. Only two passive components, capacitance diode 19 and resistor 20, are required in the invention. The invention is part of the sample-taking unit and the controlling signal is obtained directly from the detector.

In view of the foregoing description it will be evident to a person skilled in the art that various modifications may be made within the scope of the invention. In particular, the present invention could be used to compress the range of the measuring circuit as well as expand it. By this it is meant that large signals could be coupled from the power amplifier when the output power is low, in order to provide sufficient power for accurate measurement.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What we claim is:

1. A circuit for monitoring power output from an amplifier, comprising:
    a controllable varactor diode for sampling the power output from the amplifier;
    detecting circuit means coupled to an output of the varactor diode for generating a DC voltage corresponding to the magnitude of a sample from the varactor diode; and
    circuit means connected between said varactor diode and said detecting circuit means for coupling at least a portion of the DC voltage to a control electrode of the varactor diode to vary a reverse bias voltage thereacross in accord with a magnitude of said portion of the DC voltage, for controlling a level of sampling of said power output from the amplifier so that at high levels of power output, lesser values of said power output are coupled to said detecting circuit means.

2. A circuit as set forth in claim 1, further comprising:
    a comparator for comparing said DC voltage with a reference voltage and for forming a control voltage for the amplifier.

3. A circuit as set forth in claim 1, wherein the controllable sampling means further comprises a directional coupler.

4. A circuit as set forth in claim 1, wherein the controllable sampling means further comprises a coupling capacitor.

* * * * *